United States Patent [19]

Ovshinsky et al.

[11] Patent Number: 4,504,518
[45] Date of Patent: Mar. 12, 1985

[54] METHOD OF MAKING AMORPHOUS SEMICONDUCTOR ALLOYS AND DEVICES USING MICROWAVE ENERGY

[75] Inventors: Stanford R. Ovshinsky, Bloomfield Hills; David D. Allred, Troy; Lee Walter, Bloomfield Hills; Stephen J. Hudgens, Southfield, all of Mich.

[73] Assignee: Energy Conversion Devices, Inc., Troy, Mich.

[21] Appl. No.: 605,575

[22] Filed: Apr. 30, 1984

Related U.S. Application Data

[63] Continuation-in-part of Ser. No. 423,424, Sep. 24, 1982.

[51] Int. Cl.$^3$ .............................................. B05D 3/06
[52] U.S. Cl. .................................... 427/38; 427/45.1; 427/85; 427/86
[58] Field of Search ................... 427/38, 39, 45.1, 85, 427/86; 204/164

[56] References Cited

U.S. PATENT DOCUMENTS

| 4,226,898 | 10/1980 | Ovshinsky et al. | 427/39 |
| 4,363,828 | 12/1982 | Brodsky et al. | 427/86 |

FOREIGN PATENT DOCUMENTS

| 2033355 | 5/1980 | United Kingdom | 427/39 |

OTHER PUBLICATIONS

Brodsky et al., *IBM TDB*, vol. 22, No. 8A, Jan. 1980, pp. 3391, 3392.
Cohen, *Electronics*, vol. 54, No. 22, Nov. 1981, pp. 82, 84.
Aktik et al., *J. App. Phys.*, vol. 53, 1982, pp. 439–441.
Brassard et al., *Journal de Physique*, Colloque C4, Supplement an No. 10, Tome 42, pp. C4-795 to C4-798, Oct. 1981.
Mailhiot et al., *Journal of Non-Crystalline Solids*, vol. 35 and 36, 1980, pp. 207-212.
Currie et al., *Proceedings National Conference on Solar Energy*, Solar Energy Society of Canada Inc., pp. 101-104.

*Primary Examiner*—John H. Newsome
*Attorney, Agent, or Firm*—Marvin S. Siskind; Ronald W. Citkowski

[57] ABSTRACT

A low pressure process for making amorphous semiconductor alloy films and devices at high deposition rates and high gas conversion efficiencies utilizes microwave energy to form a deposition plasma. The alloys exhibit high-quality electronic properties suitable for many applications including photovoltaic and electrophotographic applications.

The process includes the steps of providing a source of microwave energy, coupling the microwave energy into a substantially enclosed reaction vessel containing the substrate onto which the amorphous semiconductor film is to be deposited, introducing into the vessel at least one reaction gas and evacuating the vessel to a low enough deposition pressure to deposit the film at high deposition rates with high reaction gas conversion efficiencies without any significant powder or polymeric inclusions. The microwave energy and the reaction gases form a glow discharge plasma within the vessel to deposit an amorphous semiconductor film from the reaction gases onto the substrate. The reaction gases can include silane ($SiH_4$), silicon tetrafluoride ($SiF_4$), silane and silicon tetrafluoride, silane and germane ($GeH_4$), and silicon tetrafluoride and germane. The reaction gases can also include germane or germanium tetrafluoride ($GeF_4$). To all of the foregoing, hydrogen ($H_2$) can also be added. Dopants, either p-type or n-type can also be added to the reaction gases to form p-type or n-type alloy films, respectively. Also, band gap increasing elements such as carbon or nitrogen can be added in the form of, for example, methane or ammonia gas to widen the band gap of the alloys.

42 Claims, 12 Drawing Figures

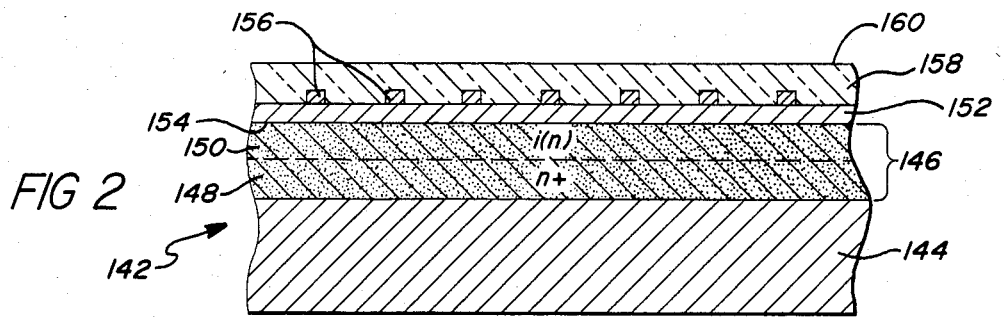
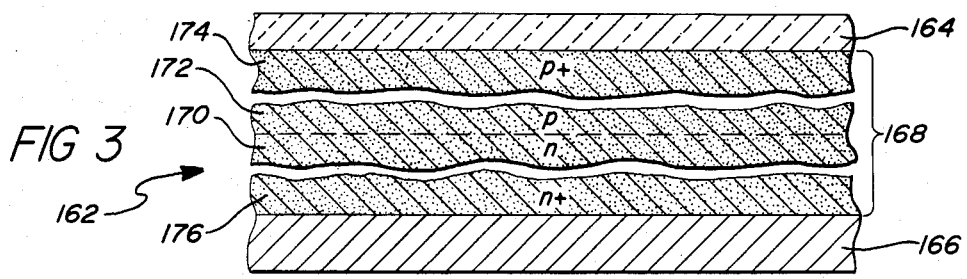
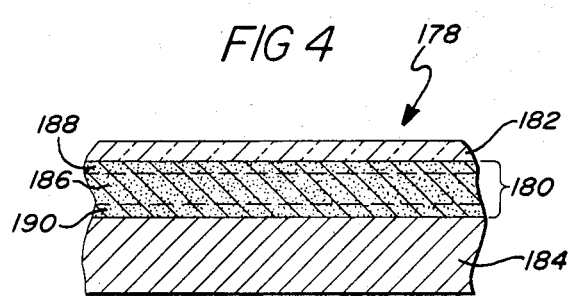
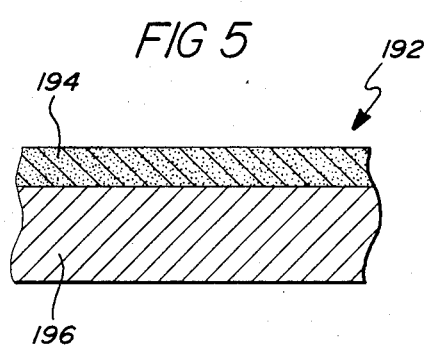
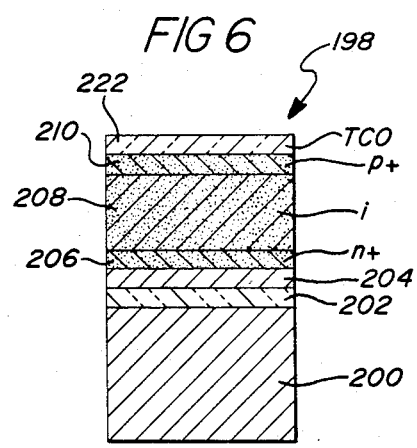
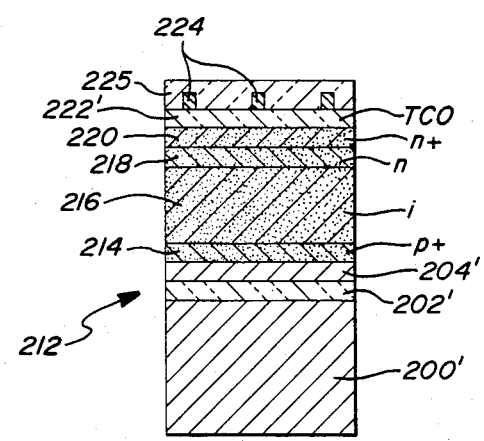

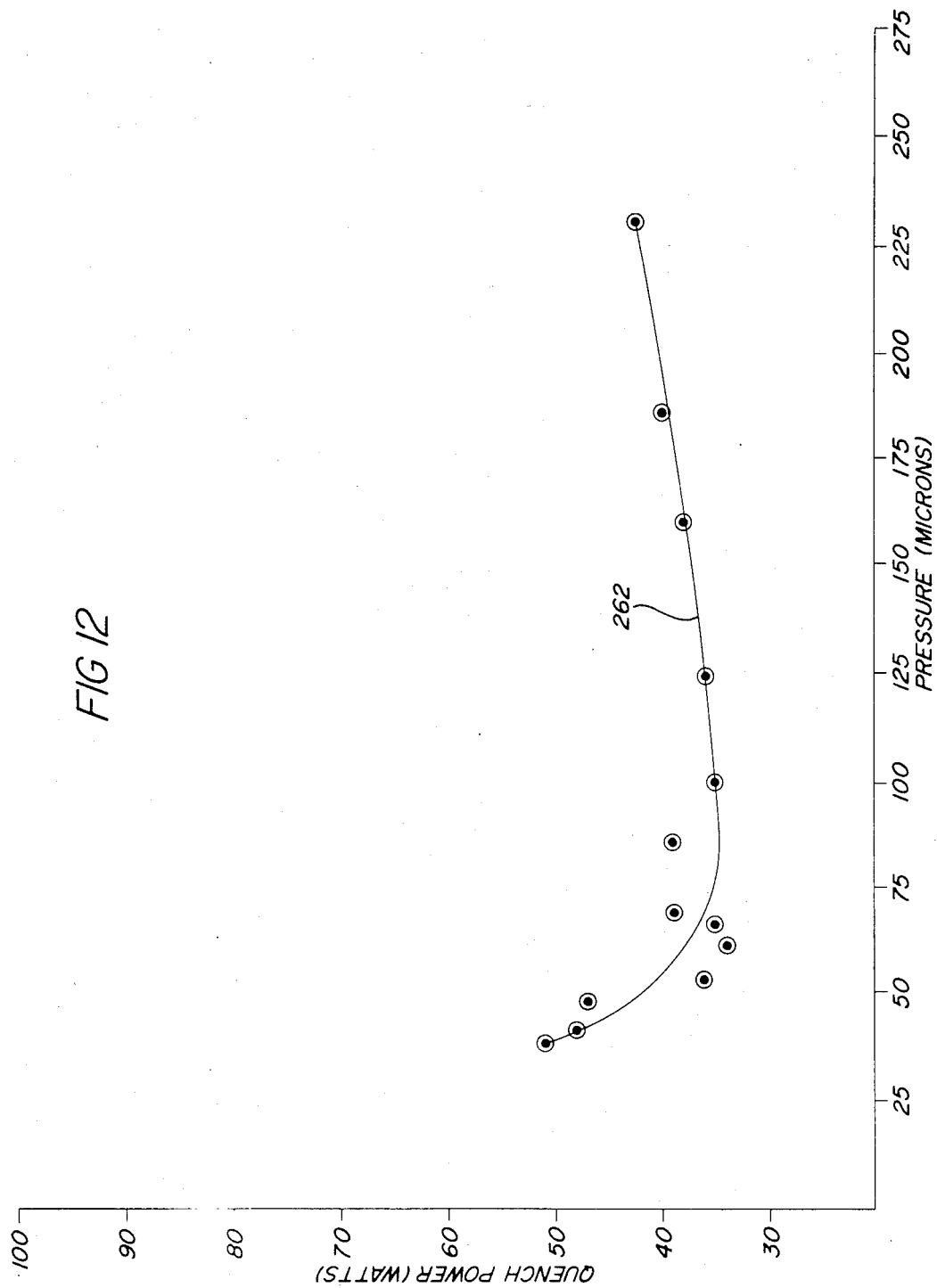

METHOD OF MAKING AMORPHOUS SEMICONDUCTOR ALLOYS AND DEVICES USING MICROWAVE ENERGY

RELATED APPLICATION

This is a continuation-in-part of pending application Ser. No. 423,424, filed Sept. 24, 1982, for Method of Making Amorphous Semiconductor Alloys and Devices Using Microwave Energy.

BACKGROUND OF THE INVENTION

This invention relates to an improved method of making amorphous semiconductor alloys and devices having a substantially increased reaction gas conversion efficiency and a substantially increased deposition rate. The invention more particularly relates to a method of making such alloys and devices by plasma deposition from reaction gases wherein the plasmas are excited by microwave energy at low pressures. The invention has its most important application in making photoresponsive alloys and devices for various photoresponsive applications including photoreceptive devices such as solar cells of a p-i-n, p-n, Schottky or MIS (metal-insulator-semiconductor) type; photoconducting medium such as utilized in xerography; photodetecting devices and photodiodes including large area photodiode arrays.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time-consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

These crystal growing processes produce such relatively small crystals that solar cells require the assembly of many single crystals to encompass the desired area of only a single solar cell panel. The amount of energy necessary to make a solar cell in this process, the limitation caused by the size limitations of the silicon crystal, and the necessity to cut up and assemble such a crystalline material have all resulted in an impossible economic barrier to the large-scale use of the crystalline semiconductor solar cells for energy conversion. Further, crystalline silicon has an indirect optical edge which results in poor light absorption in the material. Because of the poor light absorption, crystalline solar cells have to be at least 50 microns thick to absorb the incident sunlight. Even if the single crystal material is replaced by polycrystalline silicon with cheaper production processes, the indirect optical edge is still maintained; hence the material thickness is not reduced. The polycrystalline material also involves the addition of grain boundaries and other problem defects.

In summary, crystalline silicon devices have fixed parameters which are not variable as desired, require large amounts of material, are only producible in relatively small areas and are expensive and time consuming to produce. Devices based upon amorphous silicon can eliminate these crystalline silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane ($SiH_4$) was passed through a reaction tube where the gas was decomposed by an r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material, a gas of phosphine ($PH_3$) for n-type conduction or a gas of diborane ($B_2H_6$) for p-type conduction was premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the silane deposited materials leads to a narrow depletion width, which in turn limits the efficiencies of solar cells and other devices whose operation depends on the drift of free carriers. The method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above-described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Greatly improved amorphous silicon alloys having significantly reduced concentrations of localized states in the energy gaps thereof and high-quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

Amorphous semiconductor alloys made by the processes hereinabove described have demonstrated photoresponsive characteristics ideally suited for photovoltaic applications. These prior art processes, however, have suffered from relatively slow deposition rates and low utilization of the reaction gas feed stock which are important considerations from the standpoint of making photovoltaic and particularly xerographic devices from these materials on a commercial basis. In addition, these prior art processes, when practiced utilizing high RF power densities to enhance deposition rates result in the production of films with poor electrical properties, increased densities of defect states and in the production of powder in the reaction vessel due to gas phase nucleation processes.

Many techniques of exciting conventional glow discharge plasmas have been investigated. These have included direct current (DC) and alternating current (AC) techniques. Various AC frequencies have been utilized, such as audio, radio frequency (RF) and a microwave frequency of 2.56 GHz. It is known that the optimum deposition power and pressure are defined by the minimum of the Paschen curve. The Paschen curve defines the voltage (V) needed to sustain the glow discharge plasma at each pressure (P) in a range of pressures, between electrodes separated by a distance (D). In a typically sized, conventional RF glow discharge system, the minimum in the Paschen curve occurs at a few hundred mTorr.

The problem addressed by the present invention is how to achieve a high reaction gas conversion efficiency and a high deposition rate without substantially degrading the properties of the resulting alloys. It has previously been discovered that increasing the applied RF power increases the gas utilization efficiency and the deposition rate. However, simply increasing the RF power to achieve deposition rates approximately greater than 10 Å/sec. leads to the production of amorphous semiconductor films of decreasing electronic quality and can result in films which include polymeric material and/or the production of powder. The increased deposition rate with increased RF power is a result of an increase in the concentration of excited species resulting principally from collisions between electrons and feedstock molecules. However, the collision rate between excited species and more importantly between excited species and feedstock molecules is also increased. This results in the formation of polymer chains. These chains are either incorporated in the growing amorphous semiconductor film degrading its electronic quality or condensed in the gas phase to produce powder particles. To reduce the number of undesirable collisions one can reduce the operating pressure, but this moves the deposition process off the minimum of the Paschen curve and substantially higher RF power is required to achieve the same degree of plasma excitation. The physical reason for this phenomenon is that, as pressure is reduced, many electrons that would have been able to collisionally excite feedstock molecules at higher gas pressures now impinge on the substrate or system walls without suffering collisions.

Attempts have also been made to increase the gas utilization efficiency in RF glow discharge plasmas by high power deposition of a dilute mixture of silane (SiH$_4$) in an inert carrier gas such as argon. However, this is known to result in undesirable film growth conditions giving rise to columnar morphology as reported by Knights, *Journal of Non-Crystalline Solids,* Vol. 35 and 36, p. 159 (1980).

The one group which has reported glow discharge amorphous silicon alloy deposition utilizing microwave energy at 2.54 GHz treated the microwave energy as just another source of plasma excitation by performing the deposition in a plasma operating at pressures typical of conventional RF or DC glow discharge processes. C. Mailhiot et al. in the *Journal of Non-Crystalline Solids,* Vol. 35 and 36, p. 207–212 (1980) describe films deposited at 0.17 Torr to 0.30 Torr at deposition rates of between 23 and 34 Å/sec. They report that their films, which are of poor electrical quality, show clear indication of non-homogeneous structure. Thus, Mailhiot et al. failed to discover the present invention which is based on the recognition that for a given deposition system the minimum in the Paschen curve shifts to lower pressure values with increasing frequency. Therefore, the use of high frequency microwave energy in a glow discharge deposition system allows one to operate at much lower pressure and consequently to achieve a higher concentration of excited species and thus higher deposition rate and gas utilization efficiency without production of powder or inclusion of polymeric species in the amorphous semiconductor film. The shift in the minimum of the Paschen curve is believed to occur because, for a given gas pressure at the higher excitation frequency, the rapid reversals of the applied electric field allow the electrons in the plasma to collide with more feedstock molecules in the plasma excitation region before they encounter the walls of the system. Thus, the present invention provides both a substantially increased deposition rate of 100 Å/sec. or above and a feedstock conversion efficiency approaching 100% while still allowing the production of high electrical quality amorphous semiconductor films. This contrasts both with the conventional RF (eg., 13.56 MHz, 0.2 to 0.5 Torr) glow discharge deposition process which produces high quality films at deposition rates of approximately 10 Å/sec. and feedstock utilization of approximately 10% and with the Mailhiot microwave process (2.54 GHz, 0.2 Torr to 0.3 Torr) which produced poor quality films at 20 to 30 Å/sec. deposition rates.

Applicants herein have discovered a new and improved process for making amorphous semiconductor alloys and devices. The inventive process herein provides substantially increased deposition rates and reaction gas feed stock utilization. Further, the process of the present invention results in depositions from plasmas operated at lower pressure and consequently capable of powderless depositions of a semiconductor film with only small amounts of incorporated polymeric material. Still further, the process of the present invention results in the formation of reactive species not previously obtainable in sufficiently large concentrations with prior art processes. As a result, new amorphous semiconductor alloys can be produced having substantially different material properties than previously obtainable. All of the above results, by virtue of the present invention, in amorphous semiconductor alloys and devices made therefrom having improved photoresponsive characteristics while being made at substantially increased rates.

As disclosed in the aforementioned referenced U.S. Pat. No. 4,217,374, new and improved amorphous semiconductor alloys and devices can be made which are stable and composed of chemical configurations which are determined by basic bonding considerations. One of these considerations is that the material is as tetrahedrally bonded as possible to permit minimal distortion of the material without long-range order. Fluorine, for example, when incorporated into these alloy materials, performs the function of promoting tetrahedral bonding configurations. Amorphous semiconductor materials having such tetrahedral structures exhibit low densities of dangling bonds making the materials suitable for photovoltaic applications.

In accordance with one preferred embodiment, atomic fluorine and/or hydrogen are generated separately as free radicals and reacted with semiconductor free radicals generated within a plasma sustained by microwave energy. As a result, all of the advantages of separate free radical formation are obtained along with all of the advantages of microwave plasma deposition.

In making conventional xerographic devices, materials such as various amorphous chalcogenide alloys including Se$_{92}$Te$_8$; As$_2$Se$_3$; or organic alloys such as TNF-PVK have been utilized. These materials are soft, easily damaged in use, and toxic. Amorphous silicon alloys are much more desirable for this application since they are hard, non-toxic, and capable of being formulated with a wide range of spectral response characteristics. Low deposition rates and low gas utilization efficiencies have, however, hindered their commercial application. One preferred embodiment of the invention makes possible the formation of electrophotographic members by the high gas utilization efficiency and the high deposition rate achieved by the present invention.

In making a commercial photovoltaic device, it is necessary to provide environmental encapsulation of the devices to prevent undesirable chemical reactions within the device materials due to exposure to chemical species contained in the environment. For example, oxidation of contact materials must be prevented. Customarily, relatively heavy and thick materials such as glass plates or various organic polymer layers or plastic materials have been proposed to provide such protection. In accordance with a further embodiment of the present invention, such protection is provided by microwave glow discharge deposition of appropriately hard, chemically inert wide bandgap semiconductor material, deposited at high deposition rates. The microwave deposited material not only provides the required encapsulation, but is additionally light in weight and can be easily incorporated in a manner compatible with the formation of the photovoltaic materials of the devices.

SUMMARY OF THE INVENTION

The present invention provides a process for making amorphous semiconductor alloy films and devices at substantially higher rates than possible in the prior art. Even though deposition occurs at the higher rates, the alloys exhibit high-quality electronic properties suitable for many applications including photovoltaic and electrophotographic applications.

In accordance with the invention, the process includes the steps of providing a source of microwave energy, coupling the microwave energy into a substantially enclosed reaction vessel containing the substrate onto which the amorphous semiconductor film is to be deposited, and introducing into the vessel at least one reaction gas and evacuating the vessel to a low enough deposition pressure to deposit the film at high deposition rates with high reaction gas conversion efficiencies without any significant powder or polymeric inclusions. The microwave energy and the reaction gases form a glow discharge plasma within the vessel to deposit an amorphous semiconductor film from the reaction gases onto the substrate. The reaction gases can include silane ($SiH_4$), silicon tetrafluoride ($SiF_4$), silane and silicon tetrafluoride, silane and germane ($GeH_4$), or silicon tetrafluoride and germane. The reaction gases can also include germane or germanium tetrafluoride ($GeF_4$). To all of the foregoing, hydrogen ($H_2$) can also be added. Dopants, either p-type or n-type can also be added to the reaction gases to form p-type or n-type alloy films, respectively. Also, band gap increasing elements such as carbon or nitrogen can be added in the form of, for example, methane or ammonia gas to widen the band gap of the alloys.

Independent control over all of the deposition parameters can be obtained by separately generating the free radical species prior to combination in the microwave plasma. For example, atomic fluorine and/or hydrogen can be separately generated and fed into the plasma wherein the semiconductor free radicals are generated. The foregoing thereafter react in the plasma and are deposited onto the substrate to form new and improved amorphous semiconductor alloys. The semiconductor free radicals can be generated from any of the semiconductor-containing compounds previously mentioned.

Also, encapsulation of the photovoltaic devices is obtained by deposition of a relatively thin layer of transparent insulating materials over the devices. For example, the transparent materials can be silicon nitride ($Si_3N_4$) or silicon dioxide ($SiO_2$) formed, for example, by the microwave glow discharge of silane and ammonia or nitrogen and silane and oxygen respectively.

BRIEF DESCRIPTION OF THE DRAWINGS

FIG. 2 is a fragmentary sectional view of an embodiment of a Schottky barrier solar cell to illustrate one application of the amorphous semiconductor photoreceptive alloys made by the process of the invention.

FIG. 3 is a fragmentary sectional view of a p-n junction solar cell device which includes a doped amorphous semiconductor alloy made by the process of the invention;

FIG. 4 is a fragmentary sectional view of a photodetection device which includes an amorphous semiconductor alloy made by the process of the invention;

FIG. 5 is a fragmentary sectional view of a xerographic drum including an amorphous semiconductor alloy made by the process of the invention;

FIG. 6 is a fragmentary sectional view of a p-i-n junction solar cell device;

FIG. 7 is a fragmentary sectional view of an n-i-p junction solar cell device;

FIG. 12 is a modified Paschen curve for the microwave deposition conditions of the present invention.

DESCRIPTION OF THE PREFERRED EMBODIMENTS

Figure 1:
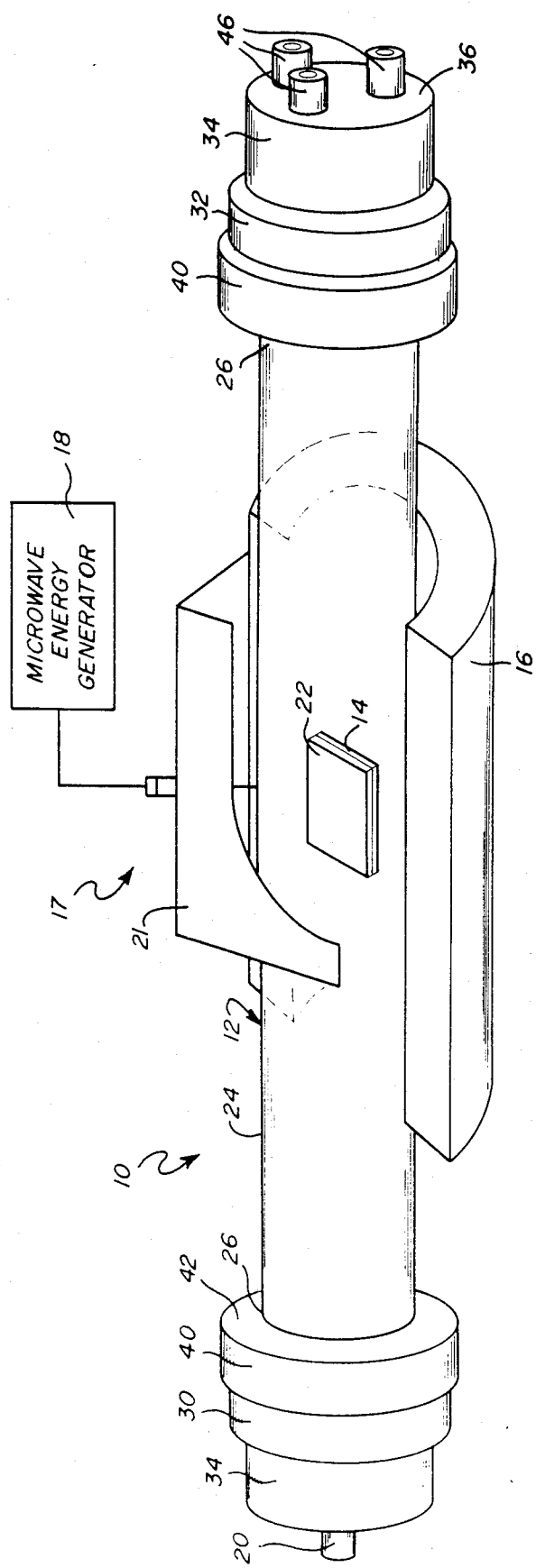
FIG. 1 is a perspective view, partly broken away, of a microwave plasma deposition system for depositing amorphous semiconductor alloy films in accordance with the process of the invention.

Referring now more particularly to FIG. 1, a microwave deposition apparatus suitable for practicing the process of the present invention is generally designated 10. The apparatus 10 comprises a transparent tubular chamber or vessel 12 containing a substrate 14 upon which the amorphous semiconductor alloy films are to be deposited. The substrate is heated by a radiant heater 16 and the exterior of the chamber is irradiated by a microwave energy source 17. Reaction gases passing from inlets 46 to an outlet 20 at opposite ends of the chamber 12 receive microwave energy from the source 17 in the area of the substrate. The combination of the reaction gases and the microwave energy from source 17 causes the formation of a plasma in the area of the substrate, resulting in the deposition of a film 22. In accordance with the present invention, the reaction gases include at least one semiconductor-containing compound to form the plasma. The temperature of the substrate can be between room temperature and about 400° C. and the frequency of the microwave energy can be 2.45 GHz and above and preferably 2.45 GHz. As mentioned, the combined microwave energy and the reaction gases form the plasma to permit the deposition process to proceed.

Referring now to FIG. 1 in greater detail, the tubular chamber 12 comprises a central quartz portion 24 and end portions 26 at opposite ends thereof. The end portions 26 are closed by a pair of end fittings 30 and 32 to complete the chamber. Each of the end fittings includes a sleeve portion 34 extending from a closed end 36 to an open end portion. The open end portion is threaded to receive a collar 40 having an inwardly extending annular flange 42 at one end thereof. An o-ring (not shown) is confined in a space between the flange 42 and the end portion for compression thereof against the quartz portion 26. An airtight seal is provided in this way between the end fittings 30 and 32 and the tubular chamber 12.

The end fittings 30 and 32 are preferably made of stainless steel or other suitable noncorrosive metal, with the closed ends 36 being welded or otherwise permanently joined to the sleeve portions 34. The closed end 36 of the end fitting 32 is provided with gas inlets 46 through which the deposition gases are introduced into the vessel 12. An inert gas such as argon can be introduced through one inlet 46 to assist in sustaining the plasma.

The gas inlets 46 are preferably connected to a conventional gas rack (not shown) for establishing regulated flows of reaction gases therein. The outlet 20 is provided at the closed end 36 to the end fitting 30 for connection to selectable first and second pumps. The first pump provides for initial evacuation of the chamber. The second pump provides withdrawal of unused reaction gases during operation and maintenance of the proper deposition pressure of 0.1 Torr or less.

The microwave energy source 17 preferably comprises a microwave energy generator 18 coupled to an antenna 19. The antenna 19 is housed within a reflective housing 21 for concentration of the microwave energy into the chamber 12. The antenna as illustrated is a vertical antenna being preferably one-quarter wavelength long. The tip of the antenna just touches the outer surface of the vessel 12 to maximize transmission of its output to the reaction gases.

The radiant heater 16 preferably comprises a conventional resistive heater. Heat is transmitted to the substrate 14 and the chamber 12 by radiation, without significant direct heating of the reaction gases. Alternatively, a resistive heating arrangement (not shown) may be provided within the chamber 12 for heating the substrate 14. In that case, power lines for the heating element would be passed through the closed end 36 of one of the end fittings.

In operation, the system 10 is first pumped down to below a desired deposition pressure, such as $10^{-5}$ Torr. The reaction gas mixture or gases such as silicon tetrafluoride ($SiF_4$), silane ($SiH_4$), silicon tetrafluoride and silane, silane and germane ($GeH_4$), or silicon tetrafluoride and germane are fed into the inlet chamber 24 through separate inlet conduits 46 and chamber 12 is brought up to the desired operating pressure. To the foregoing reaction gases, hydrogen ($H_2$) can also be added. Other reaction gases which can be utilized are germane, germanium tetrafluoride ($GeF_4$), germanium tetrafluoride and silicon tetrafluoride. Hydrogen ($H_2$) can also be added to these gases.

The microwave energy from the antenna 19 is directed by the reflective housing 21 into the vessel 12 to form a plasma in the area of the substrate. As a result, an amorphous semiconductor alloy film 22 is deposited onto the substrate 14. The heater 16 maintains the substrate at a temperature between about 20° C. and 400° C., and preferably between 250° C. and 325° C. The output power of the microwave energy generator 18 is adjusted between about 20 and 115 watts depending on the volume of the gas contained in the plasma and the composition of the gas. These power outputs preferably correlate to about 0.1 to 1.2 watts per cubic centimeter in power density. The flow rate of the reaction gases can be between 1 to 50 SCCM. The vessel is evacuated to an operating pressure of 0.001 to 0.1 Torr and preferably about 0.05 Torr or less. With the foregoing system parameters, deposition rates of 50 Å up to 250 Å per second or higher as controlled by the gas flow rate can be obtained. The reaction gas is converted to deposition species at a conversion efficiency of essentially 100%. Even at these high deposition rates, the deposited amorphous semiconductor films do not have any significant powder or polymeric inclusions and exhibit high-quality photoresponsive characteristics suitable for photovoltaic and other applications.

For making photovoltaic or other doped devices by the process of the invention, dopants can be introduced into the vessel 12 for making the deposited film either p-type or n-type. For example, to make a p-type film, diborane gas ($B_2H_6$) can be introduced through one of the inlets 46. For making n-type films, phosphine gas ($PH_3$) can be introduced into one of the inlets 46. If it is desired to increase the band gap of a material, band gap increasing elements such as carbon or nitrogen can be incorporated into the films by introducing methane ($CH_4$) or ammonia ($NH_3$) into one of the inlets 46 during deposition. The reaction gases can be sequentially introduced to result in the formation of any desired device configuration.

To assist in the maintenance of the plasma, a plasma sustaining gas can be introduced into one of the inlets 46. Argon gas can be utilized for this purpose. The deposition of amorphous semiconductor alloy films by the foregoing inventive process has demonstrated many advantages over prior deposition processes. Firstly, the microwave energy provides a higher density of free radicals than previously possible. This results in higher deposition rates, nearly total utilization of the feed stock reaction gases and enhanced reactivity of plasma species leading to incorporation in the growing film of elements which previously could not be so incorporated. This results in new materials having unique compositional and structural properties. In summary, the invention provides a process for making amorphous semiconductor films and devices at higher deposition rates and reaction gas conversion efficiencies which have improved properties and which afford wide variations in the material compositions.

Various applications of the improved amorphous alloys produced by the unique processes of the invention are illustrated in FIGS. 2 through 7. FIG. 2 shows a Schottky barrier solar cell 142 in fragmentary cross section. The solar cell 142 includes a substrate or electrode 144 of a material having good electrical conductivity properties, and the ability of making an ohmic contact with an amorphous alloy 146 compensated or altered to provide a low density of localized states in the energy gap. The substrate 144 may comprise a low work function metal, such as aluminum, tantalum, stainless steel or other material matching with the amorphous alloy 146 deposited thereon which preferably includes silicon, compensated or altered in the manner of the alloys previously described so that it has a low density of localized states in the energy gap of preferably no more than $10^{16}$ per cubic centimeter per eV. It is most preferred that the alloy have a region 148 next to the electrode 144, which region forms an n-plus conductivity, heavily doped, low-resistance interface between the electrode and an undoped, relatively high, dark resistance region 150 which is an intrinsic, but low n-conductivity region.

The upper surface of the amorphous alloy 146 as viewed in FIG. 2, joins a metallic region 152, an interface between this metallic region and the amorphous alloy 146 forming a Schottky barrier 154. The metallic region 152 is transparent or semi-transparent to solar radiation, has good electrical conductivity and is of a high work function (for example, 4.5 eV or greater, produced, for example, by gold, platinum, palladium, etc.) relative to that of the amorphous alloy 146. The metallic region 152 may be a single layer of a metal or it may be a multilayer. The amorphous alloy 146 may have a thickness of about 0.5 to 1 micron and the metallic region 152 may have a thickness of about 100 Å in order to be semi-transparent to solar radiation.

On the surface of the metallic region 152 is deposited a grid electrode 156 made of a metal having good electrical conductivity. The grid may comprise orthogonally related lines on conductive material occupying only a minor portion of the area of the metallic region, the rest of which is to be exposed to solar energy. For example, the grid 156 may occupy only about from 5 to 10% of the entire area of the metallic region 152. The grid electrode 156 uniformly collects current from the metallic region 152 to assure a good low series resistance for the device.

An anti-reflection layer 158 may be applied over the grid electrode 156 and the areas of the metallic region 152 between the grid electrode areas. The anti-reflection layer 158 has a solar radiation incident surface 160 upon which impinges the solar radiation. For example, the anti-reflection layer 158 may have a thickness on the order of magnitude of the wavelength of the maximum energy point of the solar radiation spectrum, divided by four times the index of refraction of the anti-reflection layer 158. If the metallic region 152 is platinum of 100 Å in thickness, a suitable anti-reflection layer 158 would be zirconium oxide of about 500 Å in thickness with an index of refraction of 2.1.

The Schottky barrier 154 formed at the interface between the regions 150 and 152 enables the photons from the solar radiation to produce current carriers in the alloy 146, which are collected as current by the grid electrode 156. An oxide layer (not shown) can be added between the layers 150 and 152 to produce an MIS (metal insulator semiconductor) solar cell.

In addition to the Schottky barrier or MIS solar cell shown in FIG. 2, there are solar cell constructions which utilize p-n junctions in the body of the amorphous alloy forming a part thereof formed in accordance with successive deposition, compensating or altering and doping steps like that previously described. These other forms of solar cells are generically illustrated in FIG. 3 as well as in FIGS. 6 and 7.

These constructions, such as a solar cell 162 generally include a transparent electrode 164 through which the solar radiation energy penetrates into the body of the solar cell involved. Between this transparent electrode and an opposite electrode 166 is a deposited amorphous alloy 168, preferably including silicon, initially compensated in the manner previously described. In this amorphous alloy 168 are at least two adjacent regions 170 and 172 where the amorphous alloy has respectively oppositely doped regions, region 170 being shown as an n-conductivity region and region 172 being shown as a p-conductivity region. The doping of the regions 170 and 172 is only sufficient to move the Fermi levels to the valence and conduction bands involved so that the dark conductivity remains at a low value achieved by the band adjusting and compensating or altering method of the invention. The alloy 168 has high conductivity, highly doped ohmic contact interface regions 174 and 176 of the same conductivity type as the adjacent region of the alloy 168. The alloy regions 174 and 176 contact electrodes 164 and 166, respectively.

Referring now to FIG. 4, there is illustrated another application of an amorphous alloy utilized in a photodetector device 178 whose resistance varies with the amount of light impinging thereon. An amorphous alloy 180 thereof is deposited in accordance with the invention, has no p-n junctions as in the embodiment shown in FIG. 3 and is located between a transparent electrode 182 and a substrate electrode 184. In a photodetector device it is desirable to have a minimum dark conductivity, so the amorphous alloy 180 has an undoped, but compensated or altered region 186 and heavily doped regions 188 and 190 of the same conductivity type forming a low-resistance ohmic contact with the electrodes 182 and 184, which may form a substrate for the alloy 180.

Referring to FIG. 5, an electrostatic image-producing device 192 (like a xerography drum) is illustrated. The device 192 has a low dark conductivity, selective wavelength threshold, undoped or slightly p-doped amorphous, oxygen stabilized alloy 194, deposited on a suitable substrate 196 such as a drum.

As used herein, the terms compensating agents or materials and altering agents, elements or materials mean materials which are incorporated in the amorphous alloy for altering or changing the structure thereof, such as, activated fluorine (and hydrogen) incorporated in the amorphous, alloy-containing silicon to form an amorphous silicon/fluorine/hydrogen composition alloy, having a low density of localized states in the energy gap. The activated fluorine (and hydrogen) is bonded to the silicon in the alloy and reduces the density of localized states therein; and due to the small size of the fluorine and hydrogen atoms, they are both readily introduced into the amorphous alloy without substantial dislocation of the silicon atoms and their relationships in the amorphous alloy.

Referring now to FIG. 6, a p-i-n solar cell 198 is illustrated having a substrate 200 which may be glass or a flexible web formed from stainless steel or aluminum. The substrate 200 is of a width and length as desired and preferably at least 3 mils thick. The substrate has an insulating layer 202 deposited thereon by a conventional process such as chemical deposition, vapor deposition or anodizing in the case of an aluminum substrate.

The layer 202 for instance, about 5 microns thick can be made of a metal oxide and can be eliminated if desired. For an aluminum substrate, it preferably is aluminum oxide ($Al_2O_3$) and for a stainless steel substrate it may be silicon dioxide ($SiO_2$) or other suitable glass.

An electrode 204 is deposited in one or more layers upon the layer 202 to form a base electrode for the cell 198. The substrate 200 can also form the bottom electrode without the layers 202 and 204. The electrode 204 layer or layers is deposited by vapor deposition, which is a relatively fast deposition process. The electrode layers preferably are reflective metal electrodes of molybdenum, aluminum, chrome or stainless steel for a solar cell or a photovoltaic device. The reflective electrode is preferable since, in a solar cell, non-absorbed light which passes through the semiconductor alloy is reflected from the electrode layers 204 where it again passes through the semiconductor alloy which then absorbs more of the light energy to increase the device efficiency.

The substrate 200 is then placed in the deposition environment. The specific examples shown in FIGS. 6 and 7 are only illustrative of some p-i-n junction devices which can be manufactured utilizing the improved process of the invention. For example, tandem cells can also be made by the process of the present invention. Each of the devices illustrated in FIGS. 6 and 7 has an alloy body having an overall thickness of between about 3,000 and 30,000 Å. This thickness ensures that there are no pinholes or other physical defects in the structure and that there is maximum light absorption efficiency. A thicker material may absorb more light, but at some thickness will not generate more current since the greater thickness allows more recombination of the light-generated electron-hole pairs. (It should be understood that the thicknesses of the various layers shown in FIGS. 2 through 7 are not drawn to scale.)

Referring first to forming the n-i-p device 198, the device is formed by first depositing a heavily doped $n^+$ alloy layer 206 on the electrode 204. Once the $n^+$ layer 206 is deposited, an intrinsic (i) alloy layer 208 is deposited thereon. The intrinsic layer 208 is followed by a highly doped conductive $p^+$ alloy layer 210 deposited as the final semiconductor layer. The amorphous alloy layers 206, 208 and 210 form the active layers of the n-i-p device 198.

While each of the devices illustrated in FIGS. 6 and 7 may have other utilities, they will be now described as photovoltaic devices. Utilized as a photovoltaic device, the selected outer, $p^+$ layer 210 is a low light absorption, high conductivity alloy layer. The intrinsic alloy layer 208 preferably has an adjusted wavelength threshold for a solar photoresponse, high light absorption, low dark conductivity and high photoconductivity. The bottom alloy layer 204 is a low light absorption, high conductivity $n^+$ layer. The overall device thickness between the inner surface of the electrode layer 206 and the top surface of the $p^+$ layer 210 is, as stated previously, on the order of at least about 3,000 Å. The thickness of the $n^+$ doped layer 206 is preferably in the range of about 50 to 500 Å. The thickness of the amorphous, intrinsic alloy 208 is preferably between about 3,000 to 30,000 Å. The thickness of the top $p^+$ contact layer 210 also is preferably between about 50 to 500 Å. Due to the shorter diffusion length of the holes, the $p^+$ layer generally will be as thin as possible on the order of 50 to 150 Å. Further, the outer layer (here $p^+$ layer 210) whether $n^+$ or $p^+$ will be kept as thin as possible to avoid absorption of light in the contact layer.

A second type of p-i-n junction device 212 is illustrated in FIG. 7. In this device a first $p^+$ layer 214 is deposited on the electrode layer 204' followed by an intrinsic amorphous alloy layer 216, an n amorphous alloy layer 218 and an outer $n^+$ amorphous alloy layer 220. Further, although the intrinsic alloy layer 208 or 216 (in FIGS. 6 and 7) is an amorphous alloy, the other layers are not so restricted and could, for instance, be polycrystalline, such as layer 214. (The inverse of the FIGS. 6 and 7 structure not illustrated, also can be utilized.)

Following the deposition of the various semiconductor alloy layers in the desired order for the devices 198 and 212, a further deposition step is performed, preferably in a separate deposition environment. Desirably, a vapor deposition environment is utilized since it is a fast deposition process. In this step, a TCO layer 222 (transparent conductive oxide) is added which, for example, may be indium tin oxide (ITO), cadmium stannate ($Cd_2SnO_4$), or doped tin oxide ($SnO_2$). The TCO layer will be added following the post compensation of fluorine (and hydrogen) if the films were not deposited with one or more of the desired compensating or altering elements therein. Also, the other compensating or altering elements, above described, can be added by post compensation.

An electrode grid 224 can be added to either of devices 198 or 212 if desired. For a device having a sufficiently small area, the TCO layer 222 is generally sufficiently conductive such that the grid 224 is not necessary for good device efficiency. If the device is of a sufficiently large area or if the conductivity of the TCO layer 222 is insufficient, the grid 224 can be placed on the layer 222 to shorten the carrier path and increase the conduction efficiency of the devices.

Lastly, a transparent encapsulant 225 is deposited over the grid 224. This encapsulant can comprise, for example, silicon nitride ($Si_3N_4$) or silicon dioxide ($SiO_2$) formed from the microwave deposition of silane and nitrogen or ammonia or silane and oxygen respectively. These encapsulants can be called insulators or wide band gap semiconductors. The layer 225 of transparent material can have a thickness of about one to fifty microns.

If the layer 225 is formed from silicon nitride or silicon dioxide, the deposition temperature can be room temperature to 300° C. and the deposition pressure preferably can be between 0.001 and 0.04 Torr. The reaction gas flow range can be about 2–10 SCCM and the power density can be about 0.1 to 1.2 watts per cubic centimeter. For silicon nitride, the reaction gas mixture can be from 0.1 to 50% $SiH_4$ in $N_2$.

Each of the device semiconductor alloy layers can be deposited upon the substrate by the apparatus illustrated in FIG. 1. The vessel 12 initially is evacuated to purge or eliminate impurities in the atmosphere from the deposition system. The alloy material preferably is then fed into the deposition chamber in a compound gaseous form, most advantageously as semiconductor containing compounds for intrinsic materials. The reactive gas can contain band gap narrowing elements such as germanium to form an intrinsic, amorphous semiconductor alloy having a narrowed band gap. The microwave generator is energized and the plasma is obtained from the gas mixture. The band gap narrowing and increasing elements can be called band gap adjusting elements.

The semiconductor material is deposited from the plasma onto the substrate which can be heated to the desired deposition temperature for each alloy layer. For example, the substrate temperature can be 275° C. for amorphous silicon and germanium alloys and 200° C. for amorphous germanium alloys deposited from GeF$_4$ or GeH$_4$. The doped layers of the devices are deposited at various temperatures of for example 250° C. to 300° C. depending upon the form of the material used. The upper limitation on the substrate temperature in part is due to the type of metal substrate utilized. For an initially hydrogen compensated amorphous alloy to be produced, such as to form the intrinsic layer in n-i-p or p-i-n devices, the substrate temperature should be less than about 400° C. and preferably about 275° C.

The doping concentrations are varied to produce the desired p, p+, n or n+ type conductivity as the alloy layers are deposited for each device. For n or p doped layers, the material is doped with 5 to 100 ppm of dopant material as it is deposited. For n+ or p+ doped layers the material is doped with 100 ppm to over 1 percent of dopant material as it is deposited.

Figure 8:
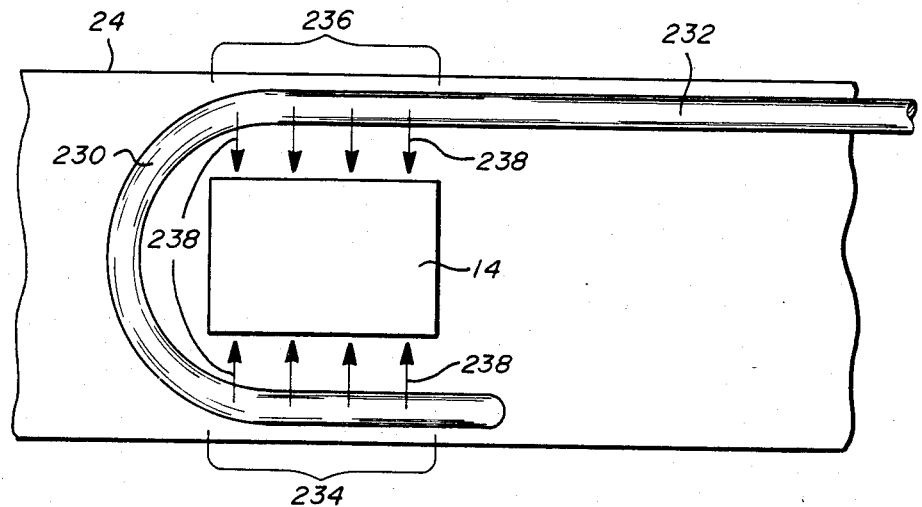
FIG. 8 is a partial top plan view of an alternative gas feed arrangement for the apparatus of FIG. 1 in accordance with a further embodiment of the present invention.

Referring now to FIG. 8, there is illustrated an alternative gas feed system for the apparatus of FIG. 1. The gas feed system includes a gas distribution manifold 230 within the enclosed chamber 24. The manifold 230 has an extension 232 which extends through the chamber end cap (not shown) for receiving the various gas mixtures to be utilized in the microwave plasma. The gas mixtures can be any of the gas mixtures previously identified. As can be seen in FIG. 8, the manifold loops around the substrate 14 and includes a plurality of outlets along substantially parallel portions 234 and 236. This allows the reaction gases indicated by arrows 238 to be evenly distributed over the substrates to result in a more uniform plasma. As a result, the amorphous semiconductor alloy film deposited onto the substrate 14 will have uniform electrical and optical properties across the substrate 14. Such an arrangement is advantageous when using gases such as, for example, silicon tetrafluoride and germane, or silicon tetrafluoride and germanium tetrafluoride wherein the silicon compounds and germanium compounds have different disassociation energies and consequently would otherwise result in a deposited film which exhibits a compositional non-uniformity in the direction of feed gas flow across the substrate.

Figure 9:
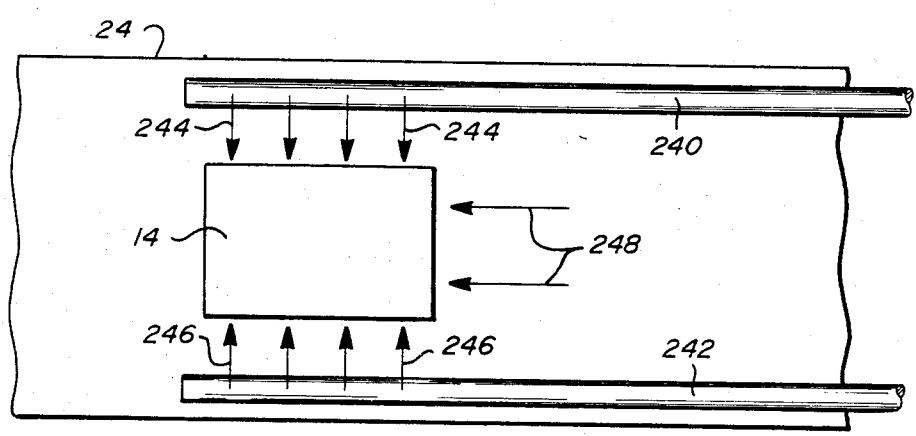
FIG. 9 is a partial top plan view of a free radical distribution system for the apparatus of FIG. 1 in accordance with another embodiment of the present invention.

Referring now to FIG. 9, there is illustrated a system of feeding into the plasma atomic fluorine and/or hydrogen which have been separately generated. The system includes a pair of conduits 240 and 242 which extend into the chamber 24 on opposite sides of the substrate 14. The conduits 240 and 242 are substantially equally spaced from the substrate and include outlets in the vicinity of the substrate for evenly distributing atomic fluorine and/or hydrogen (indicated by arrows 244 and 246) into the plasma over the substrate 14. The atomic fluorine and/or hydrogen can then react with the semiconductor free radicals within the plasma disassociated from the semiconductor-containing gases 248 fed into the chamber 24 through inlets 46 (not shown). The atomic fluorine and/or hydrogen and the semiconductor free radicals react to form a film on the substrate. As a result, the system of FIG. 9 provides separate control over the free radicals within the plasma to enable selective incorporation of desired species into the plasma from which the film is deposited.

Other free radicals can of course be introduced by adding additional conduits. For example, free radicals of boron can be introduced to provide substitutional doping within the deposited film to form an improved p-type alloy. Such an alloy is particularly useful in making photovoltaic devices.

Figure 10:
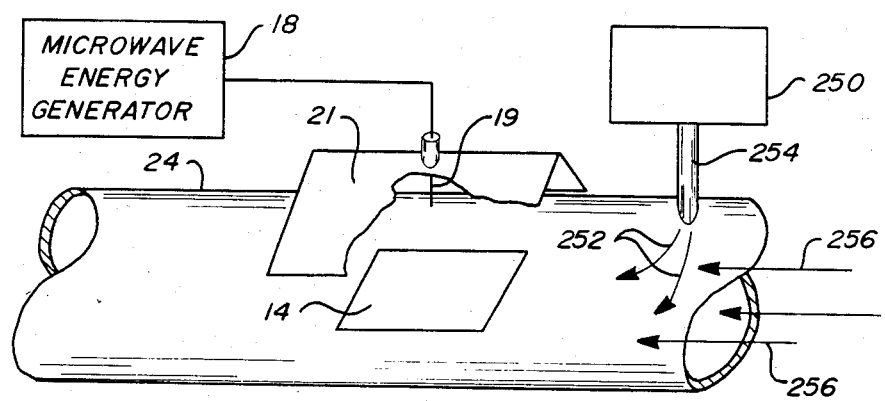
FIG. 10 is a partial perspective view of another microwave plasma deposition system in accordance with a still further embodiment of the present invention.

Referring now to FIG. 10, there is illustrated another microwave deposition system 249 in accordance with a further embodiment of the invention. In this system a free radical generator 250, including a "Woods Horn" 254 known in the art, is used to feed selected free radicals 252 into the chamber 24. Of course, additional generators 250 can be provided. A microwave source as in FIG. 1 can be provided including a microwave generator 18, an antenna 19, and a reflective housing 21. The generator 18 can provide the free radical generator 250 with microwave energy, or the free radical generator 250 can include its own source of microwave energy.

The free radicals 252 react with the reactive species formed within the plasma from the reaction gases 256 to form a film on the substrate 14. Hence, as in the previous embodiment, selected free radicals can be introduced into the plasma at will to form new and improved amorphous semiconductor alloys.

The atomic fluorine and/or hydrogen within the plasma provides amorphous semiconductor alloys having improved structural and chemical properties. Infrared spectroscopy shows a significant silicon-fluorine peak in the alloys indicating that the fluorine is bonding to the silicon in a preferred manner providing material stability and reduced density of states. This is of particular importance in the fabrication of photovoltaic devices.

Figure 11:
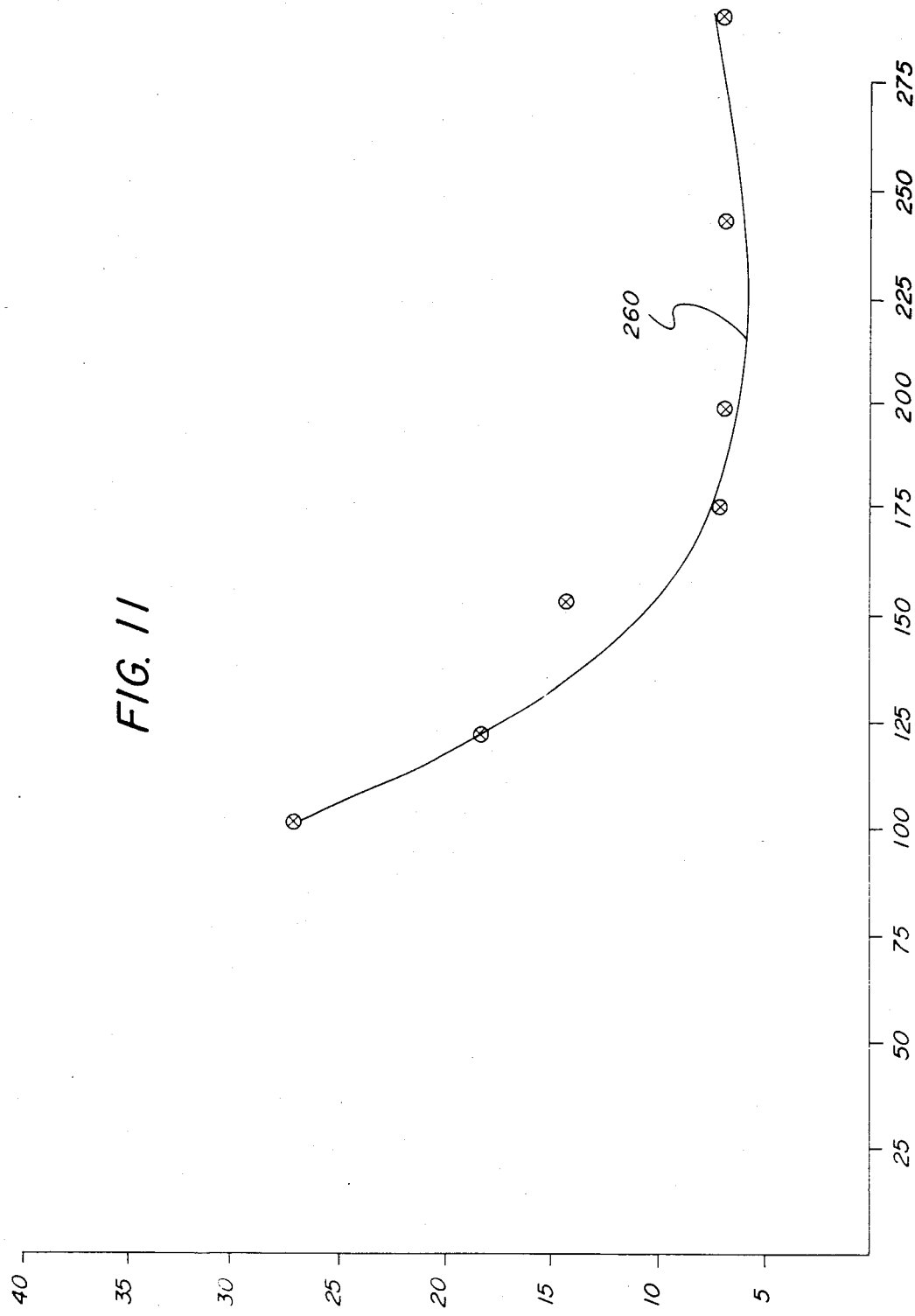
FIG. 11 is a modified Paschen curve for conventional RF deposition conditions.

FIG. 11 illustrates a curve 260 which is produced utilizing conventional RF deposition techniques of SiH$_4$, which is a modified Paschen curve. As above mentioned, a Paschen curve is the voltage needed to sustain a plasma at each pressure. The modified curve is related to the power needed to sustain a plasma at each pressure. The normal operating range is dictated by the minimum of the curve, which for the curve shown is about 0.2 to 0.25 Torr.

FIG. 12 illustrates a modified Paschen curve 262 for the microwave deposition process of the invention, again utilizing SiH$_4$ as the reaction gas. The curve 262 shows the clear shift in the curve to lower pressure for the microwave deposition process of the invention, which results in an operating range of about 0.075 to 0.1 Torr or below for the invention. The curve shifts for other reaction gases and deposition system dimensions and lower pressures are preferred.

FIGS. 11 and 12 clearly show that Mailhiot failed to discover the present invention. The Mailhiot et al. published results indicated pressure ranges of 0.17 to 0.30 Torr to achieve deposition rates of 23 to 34 Å. The density of states of this material was not published, but it was stated that the results were "not compatible with a single, homogeneous a-Si:H film . . ." That statement and the high activation energy of 0.1 eV would lead one to conclude that the film had more than one phase which would indicate polymer and/or powder inclusions.

A second article published two years later, by the same group, M. Aklik et al., *Journal of Applied Physics*, Vol. 53(1) p. 439–441 describes films which do have good RF qualities, with a density of states of $10^{17}$ cm$^{-3}$eV$^{-1}$. This film was, however, deposited essentially under RF conditions, with a deposition rate of 10 Å per second at a pressure of 0.27 Torr. Clearly, the microwave source is merely being utilized as another type of deposition source without any appreciation of the high deposition rates and high gas conversion efficiencies (which are not mentioned) provided by the present invention.

Amorphous semiconductor alloy films can be deposited by the present invention in the following ranges of operating parameters.
Pressure: 0.001 to 0.1 Torr
Deposition Rate: 50 Å/sec. to 250 Å and above
Substrate Temperature: 250° C. to 325° C.
Power Density: 0.1 w/cm$^3$ to 1.2 w/cm$^3$
Reaction Gas Conversion Efficiency: Essentially or substantially 100%.

Examples of some specific films deposited by the process of the invention are:
an a-Si:H alloy film deposited from SiH$_4$ at 120 Å/sec., at 0.05 Torr, at 300° C.;
an a-Si:H:F alloy film deposited from a mixture of 2 parts SiF$_4$ to 9 parts SiH$_4$ at 125 Å/sec., at 0.065 Torr, at 300° C.;
an Si$_3$N$_4$ alloy film deposited from equal parts of SiH$_4$ and N$_2$ at 133 Å/sec., at 0.044 Torr, at 300° C.;
an SiO$_2$ alloy film deposited from five parts of an equal mixture of O$_2$ in SiF$_4$ and 1 part H$_2$ at 55 Å/sec., at 0.04 Torr, at 300° C. The a-Si:H and a-Si:H:F alloy films made by the present invention have activation energies of 0.7 to 0.8 eV, $\sigma_L$ (under AM 1) of about $3\times10^{-5}$ or better and $\sigma_D$ of about $5\times10^{-10}$ or better which indicates alloys of good electronic quality in contrast to those materials of Mailhiot. To further emphasize the effects of the pressure difference, two alloy films were deposited in the same system with only the pressure being changed. The alloy films were both deposited at about the same rate of 150 Å/sec. from a mixture of 30 parts SiH$_4$ to 7.2 parts of SiF$_4$ at 300° C. The first alloy film was deposited at 0.023 Torr and had a $\sigma_L$ of $4\times10^{-6}$ and a $\sigma_D$ of $4\times10^{-11}$. The second alloy film was deposited at 0.12 Torr and had a $\sigma_L$ of $5\times10^{-7}$ and a $\sigma_D$ of $1.3\times10^{-9}$, caused by the increase in defect density.

Modifications and variations of the present invention are possible in light of the above teachings. As previously mentioned, the alloy layers other than the intrinsic alloy layer can be other than amorphous layers, such as polycrystalline layers. (By the term "amorphous" is meant an alloy or material which has long-range disorder, although it may have short or intermediate order or even contain at times some crystalline inclusions.) It is therefore, to be understood that within the scope of the appended claims the invention may be practiced otherwise than as specifically described.

What is claimed and desired to be secured by Letters Patent of the United States is:

1. A process for depositing amorphous semiconductor alloy films onto a substrate, comprising:
   providing a source of microwave energy;
   coupling said microwave energy into a substantially enclosed reaction vessel containing the substrate;
   introducing into said vessel at least one reaction gas to form a glow discharge plasma within said vessel to form reaction gas species from said reaction gas; and
   evacuating said reaction vessel to a deposition pressure of 0.1 torr or less so as to provide for the deposition of an amorphous semiconductor alloy film from said reaction gas species onto said substrate at high deposition rates with high reaction gas conversion efficiencies without any significant powder or polymeric inclusions.

2. The process as defined in claim 1 wherein said reaction gas species are deposited at greater than 50 Angstroms per second.

3. The process as defined in claim 1 wherein said reaction gas species are deposited in the range of 50 to 250 Angstroms per second or greater.

4. The process as defined in claim 1 including evacuating said reaction vessel to a deposition pressure in the range of 0.001 to 0.1 Torr.

5. The process as defined in claim 1 including converting greater than 10 percent of said reaction gas to reaction gas species.

6. The process as defined in claim 1 including converting substantially 100 percent of said reaction gas to reaction gas species.

7. The process as defined in claim 1 wherein said reaction gas includes at least silicon.

8. The process as defined in claim 7 wherein said reaction gas is silane (SiH$_4$).

9. The process as defined in claim 7 wherein said reaction gas is silicon tetrafluoride (SiF$_4$).

10. The process as defined in claim 7 wherein said reaction gas is silicon tetrafluoride (SiF$_4$) and hydrogen (H$_2$).

11. The process as defined in claim 7 wherein said reaction gas is silane (SiH$_4$) and silicon tetrafluoride (SiF$_4$).

12. The process as defined in claim 7 wherein said reaction gas is silane (SiH$_4$) and germane (GeH$_4$).

13. The process as defined in claim 7 wherein said reaction gas is silicon tetrafluoride (SiF$_4$) and germane (GeH$_4$).

14. The process as defined in claim 7 wherein said reaction gas further includes hydrogen (H$_2$).

15. The process as defined in claim 1 wherein said reaction gas includes at least germanium.

16. The process as defined in claim 15 wherein said reaction gas is germane (GeH$_4$).

17. The process as defined in claim 15 wherein said reaction gas is germanium tetrafluoride (GeF$_4$).

18. The process as defined in claim 15 wherein said reaction gas further includes hydrogen (H$_2$).

19. The process as defined in claim 1 wherein said reaction gas includes a dopant containing compound.

20. The process as defined in claim 19 wherein said dopant containing compound includes boron.

21. The process as defined in claim 20 wherein said dopant containing compound is diborane (B$_2$H$_6$).

22. The process as defined in claim 19 wherein said dopant containing compound includes phosphorus.

23. The process as defined in claim 22 wherein said dopant containing compound is phosphine (PH$_3$).

24. The process as defined in claim 1 further including the step of introducing a plasma sustaining gas into said vessel with said reaction gas.

25. The process as defined in claim 24 wherein said plasma sustaining gas is argon.

26. The process as defined in claim 1 wherein said deposited semiconductor film has a band gap and wherein said reaction gas includes a band gap adjusting element.

27. The process as defined in claim 26 wherein said band gap adjusting element is a band gap increasing element.

28. The process as defined in claim 27 wherein said band gap increasing element is carbon or nitrogen.

29. The process as defined in claim 28 wherein said reaction gas includes ammonia gas ($NH_3$).

30. The process as defined in claim 28 wherein said reaction gas includes methane gas ($CH_4$).

31. The process as defined in claim 26 wherein said band gap adjusting element is a band gap decreasing element.

32. The process as defined in claim 31 wherein said band gap decreasing element is germanium.

33. The process as defined in claim 1 further including the step of maintaining the temperature of said substrate between about 250° Centigrade and 325° Centigrade.

34. The process as defined in claim 1 further including the step of adjusting the power output of said microwave energy to provide power densities between about 0.1 to 1.2 watts per cubic centimeter.

35. The process as defined in claim 1 wherein the frequency of said microwave energy is 2.45 Gigahertz.

36. The process as defined in claim 1 wherein said process forms one step in a multi-step process for forming successively deposited alloy layers of opposite (p and n) conductivity type, the n-type layer being formed by introducing into said vessel a reaction gas containing an n-type dopant element which is deposited with the deposited layer to produce an n-type layer and the p-type layer being formed by introducing into said vessel a reaction gas containing a p-type dopant element which is deposited with the deposited layer to produce a p-type layer.

37. The process as defined in claim 36 wherein there is deposited between said p and n doped layers an intrinsic amorphous semiconductor alloy layer without a p or n dopant element present therein.

38. The process as defined in claim 1 wherein said semiconductor alloy film is a wide band gap alloy.

39. The process as defined in claim 38 wherein said reaction gas is silane ($SiH_4$) and nitrogen ($N_2$) or ammonia ($NH_3$).

40. The process as defined in claim 39 wherein said reaction gas is silicon tetrafluoride ($SiF_4$) and nitrogen ($N_2$) or ammonia ($NH_3$).

41. The process as defined in claim 38 wherein said reaction gas is silane ($SiH_4$) and oxygen ($O_2$).

42. The process as defined in claim 41 wherein said reaction gas is silicon tetrafluoride ($SiF_4$) and oxygen ($O_2$).

* * * * *